United States Patent
Hung et al.

(10) Patent No.: US 10,403,819 B2
(45) Date of Patent: Sep. 3, 2019

(54) PIXEL DEFINE LAYER AND MANUFACTURING METHOD THEREOF AND RELATED LIGHT EMITTING DISPLAY

(71) Applicant: BOE TECHNOLOGY GROUP CO., LTD., Beijing (CN)

(72) Inventors: Hsiao-Wen Hung, Beijing (CN); Hao-Chih Hung, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/322,416

(22) PCT Filed: Feb. 19, 2016

(86) PCT No.: PCT/CN2016/074133
§ 371 (c)(1),
(2) Date: Dec. 27, 2016

(87) PCT Pub. No.: WO2016/145965
PCT Pub. Date: Sep. 22, 2016

(65) Prior Publication Data
US 2018/0138411 A1  May 17, 2018

(30) Foreign Application Priority Data
Mar. 19, 2015  (CN) .......................... 2015 1 0122737

(51) Int. Cl.
*H01L 27/32*  (2006.01)
*H01L 51/00*  (2006.01)
*H01L 51/50*  (2006.01)

(52) U.S. Cl.
CPC ...... *H01L 51/0012* (2013.01); *H01L 27/3246* (2013.01); *H01L 27/3283* (2013.01);
(Continued)

(58) Field of Classification Search
CPC ............. H01L 51/0096; H01L 27/3246; H01L 51/0012; H01L 27/3283; H01L 51/0005; H01L 51/502
See application file for complete search history.

(56) References Cited

U.S. PATENT DOCUMENTS

2006/0249732 A1  11/2006  Shirasaki et al.
2011/0064947 A1*  3/2011  Aiba ................. C08J 7/045
                                       428/354
(Continued)

FOREIGN PATENT DOCUMENTS

| CN | 102110788 | 6/2011 |
| CN | 102157707 | 8/2011 |
| CN | 104020560 | 9/2014 |
| CN | 104167430 | 11/2014 |
| CN | 104733505 | 6/2015 |

OTHER PUBLICATIONS

Written Opinion of the International Searching Authority from corresponding PCT Application No. PCT/CN 2016/074133, dated May 30, 2016 (3 pages).
(Continued)

*Primary Examiner* — Julia Slutsker
(74) *Attorney, Agent, or Firm* — Harness, Dickey & Pierce, P.L.C.

(57) ABSTRACT

A pixel define layer and manufacturing method thereof and the related light emitting display are disclosed. The pixel define layer is arranged on a conductive layer of a substrate and comprises a base film layer. The base film layer has a plurality of openings each of which corresponds to a light-emitting region of a sub-pixel unit. A spacing base body is formed between the adjacent openings. An upper surface of each spacing base body is coated with a hydrophobic quantum dot material and a side wall of each opening is coated with a hydrophilic quantum dot material. With the pixel define layer and manufacturing method thereof and the related light emitting display according to embodiments of
(Continued)

the disclosure, the ink within the sub-pixel would not ooze to the outside of the sub-pixel to result in color mixture between the adjacent sub-pixels, and the light emitting region within the pixel would not be decreased. By selecting suitable quantum dot materials, the photochromic efficiency can be improved. The process is simple and suitable for large size.

20 Claims, 4 Drawing Sheets

(52) U.S. Cl.
CPC ...... *H01L 51/0096* (2013.01); *H01L 51/0005* (2013.01); *H01L 51/502* (2013.01)

(56) References Cited

U.S. PATENT DOCUMENTS

| | | |
|---|---|---|
| 2011/0127502 A1* | 6/2011 | Kim .................... H01L 27/3283 257/40 |
| 2011/0127507 A1 | 6/2011 | Choi et al. |
| 2014/0014896 A1* | 1/2014 | Chung .................... H01L 33/14 257/13 |
| 2016/0247862 A1 | 8/2016 | Song et al. |

OTHER PUBLICATIONS

Office Action from corresponding Chinese Application No. 201510122737.5, dated Mar. 27, 2017 (7 pages).

* cited by examiner

S1: COAT A LAYER OF PHOTORESIST ON A CONDUCTIVE LAYER OF A SUBSTRATE, FORM A PLURALITY OF OPENINGS BY EXPOSING, DEVELOPING AND ETCHING, EACH OPENING CORRESPONDING TO A LIGHT-EMITTING REGION OF A SUB-PIXEL UNIT, AND A SPACING BASE BODY BEING FORMED BETWEEN ADJACENT OPENINGS, THEREBY FORMING A BASE FILM LAYER

S2: SPRAY A HYDROPHOBIC QUANTUM DOT MATERIAL ON UPPER SURFACES OF THE SPACING BASE BODIES, AND SPRAY A HYDROPHILIC QUANTUM DOT MATERIAL ON SIDE WALLS OF THE OPENINGS OR THE SIDE WALLS AND BOTTOM WALLS OF THE OPENINGS; OR

SPRAY THE HYDROPHILIC QUANTUM DOT MATERIAL ON THE UPPER SURFACES OF THE SPACING BASE BODIES AND THE SIDE WALLS OF THE OPENINGS, OR SPRAY THE HYDROPHILIC QUANTUM DOT MATERIAL ON THE UPPER SURFACES OF THE SPACING BASE BODIES AND THE SIDE WALLS AND BOTTOM WALLS OF THE OPENINGS, AND TRANSFORM THE HYDROPHILIC QUANTUM DOT MATERIAL ON THE UPPER SURFACES OF THE SPACING BASE BODIES INTO THE HYDROPHOBIC QUANTUM DOT MATERIAL; OR

SPRAY THE HYDROPHOBIC QUANTUM DOT MATERIAL ON THE UPPER SURFACES OF THE SPACING BASE BODIES AND THE SIDE WALLS OF THE OPENINGS, OR SPRAY THE HYDROPHOBIC QUANTUM DOT MATERIAL THE UPPER SURFACES OF THE SPACING BASE BODIES AND THE SIDE WALLS AND BOTTOM WALLS OF THE OPENINGS, AND TRANSFORM THE HYDROPHOBIC QUANTUM DOT MATERIAL ON THE SIDE WALLS OF THE OPENINGS OR THE SIDE WALLS AND BOTTOM WALLS OF THE OPENINGS INTO THE HYDROPHILIC QUANTUM DOT MATERIAL

Fig. 3

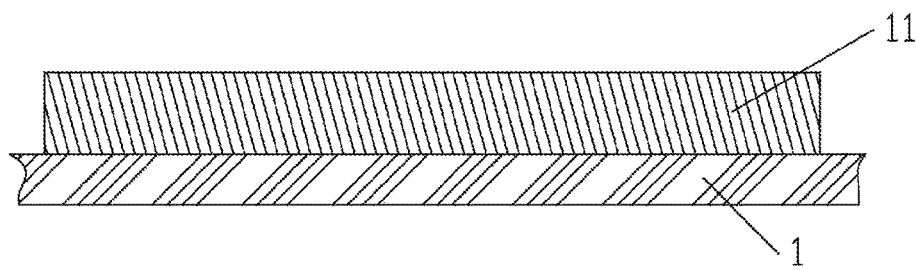

Fig. 4

PIXEL DEFINE LAYER AND MANUFACTURING METHOD THEREOF AND RELATED LIGHT EMITTING DISPLAY

This application claims the benefit and priority of Chinese Patent Application No. 201510122737.5 filed on Mar. 19, 2015, the entire disclosure of which is incorporated by reference herein.

TECHNICAL FIELD

Exemplary embodiments of the present disclosure relate to a pixel define layer and manufacturing method thereof and related light emitting display.

BACKGROUND

There are two kinds of film-forming methods for Organic Light Emitting Diode (OLED): evaporation process and solution-based process. The evaporation process is relatively mature for small size OLED, and has been applied to mass production currently. The solution-based process mainly comprise inkjet printing, nozzle coating, spin coating and screen printing, etc. The inkjet printing technique is considered as an important method for large size OLED to achieve mass production, due to high efficiency of material utilization and implementation of large size.

In the inkjet printing process, a pixel define layer (Bank) needs to be manufactured on electrodes of a substrate in advance to define that the ink flows into a specified sub-pixel region accurately. An upper surface of the pixel define layer requires a hydrophobic material with low surface energy to ensure that the ink would not ooze to the outside of the pixel to result in color mixture between the pixels. An inclined surface of the pixel define layer requires a hydrophilic material with high surface energy to ensure that the liquids can spread on a conductive glass within the pixel without an aperture. In addition, luminous efficiency of a light emitting display is also a bottleneck for materials.

As to the existing pixel define layer with trapezoid shape, after the hydrophobic treatment, the organic layer spreads badly. There may exist an un-spreading region at the edges of the conductive glass and the pixel define layer, which may, after evaporation of cathodes, cause cathode and anode short circuit to leakage. The pixel define layer with reversed trapezoid shape may allow the ink to spread well within the pixel. However such the pixel define layer may reduce discontinuous light emitting region of the cathode. Therefore it needs to increase film thickness or evaporate the cathode thickly. A double-layer pixel define layer with trapezoid shape may avoid the cathode and anode short circuit in a single-layer pixel define layer, and may be possible to reduce the light emitting region.

SUMMARY

According to embodiments of the present disclosure, a pixel define layer and manufacturing method thereof and the related light emitting display are provided, which can ensure that the ink within a sub-pixel would not ooze to the outside of the sub-pixel to result in color mixture between adjacent sub-pixels, and cannot reduce the light emitting region within the pixel. By selecting suitable quantum dot materials, the photochromic efficiency can be improved. In addition, the process is simple and is suitable for large size.

According to a first aspect of the disclosure, a pixel define layer is provided. The pixel define layer is arranged on a conductive layer of a substrate and comprises a base film layer. The base film layer has a plurality of openings, each of which corresponds to a light-emitting region of a sub-pixel unit. A spacing base body is formed between the adjacent openings. An upper surface of each spacing base body is coated with a hydrophobic quantum dot material and a side wall of each opening is coated with a hydrophilic quantum dot material.

According to some embodiments of the disclosure, a longitudinal section of the spacing base body presents trapezoid or reversed trapezoid.

According to some embodiments of the disclosure, a height of the spacing base body is 0.1-100 μm.

According to some embodiments of the disclosure, a height of the spacing base body is 0.5-5 μm.

According to some embodiments of the disclosure, a bottom of each opening is coated with a hydrophilic quantum dot material.

According to some embodiments of the disclosure, the substrate is a conductive glass substrate.

According to a second aspect of the disclosure, a light emitting display employing the pixel define layer described above is provided.

According to a third aspect of the disclosure, a method for manufacturing a pixel define layer is provided. The method comprises:

S1: coating a layer of photoresist on a conductive layer of a substrate, forming a plurality of openings by exposing, developing and etching, each of the openings corresponding to a light-emitting region of a sub-pixel unit, and a spacing base body being formed between adjacent openings, thereby forming a base film layer;

S2: spraying a hydrophobic quantum dot material on upper surfaces of the spacing base bodies, and spraying a hydrophilic quantum dot material on side walls of the openings or the side walls and bottoms of the openings; or spraying the hydrophilic quantum dot material on the upper surfaces of the spacing base bodies and the side walls of the openings, or spraying the hydrophilic quantum dot material on the upper surfaces of the spacing base bodies and the side walls and bottoms of the openings, and transforming the hydrophilic quantum dot material on the upper surfaces of the spacing base bodies into the hydrophobic quantum dot material; or spraying the hydrophobic quantum dot material on the upper surfaces of the spacing base bodies and the side walls of the openings, or spraying the hydrophobic quantum dot material on the upper surfaces of the spacing base bodies and the side walls and bottoms of the openings, and transforming the hydrophobic quantum dot material on the side walls of the openings or the side walls and bottoms of the openings into the hydrophilic quantum dot material.

According to some embodiments of the disclosure, the photoresist is a negative photoresist and a longitudinal section of the spacing base body presents reversed trapezoid in S1.

According to some embodiments of the disclosure, the photoresist is a positive photoresist and a longitudinal section of the spacing base body presents trapezoid in S1.

According to some embodiments of the disclosure, in S2, the hydrophobic quantum dot material is transformed into the hydrophilic quantum dot material by means of functional group replacement, ultrasonic emulsification or photo-irradiation. Alternatively, the hydrophilic quantum dot material is transformed into the hydrophobic quantum dot material by means of functional group replacement.

According to some embodiments of the disclosure, the substrate is made of conductive glass.

BRIEF DESCRIPTION OF DRAWINGS

To explain the embodiments of the disclosure or the technical solution in the prior art more clearly, the drawings used in the description of the embodiments or the prior art will be described briefly. It is obvious that the drawings described below are merely some embodiments of the disclosure, those of ordinary skill in the art can achieve other drawings according to these drawings without creative efforts.

FIG. 3 is a flowchart of the method for manufacturing the pixel define layer according to an embodiment of the disclosure;

FIG. 4 is a cross-section view illustrating the coating of the positive photoresist in the manufacturing method according to an embodiment of the disclosure;

DETAILED DESCRIPTION

Figure 1:
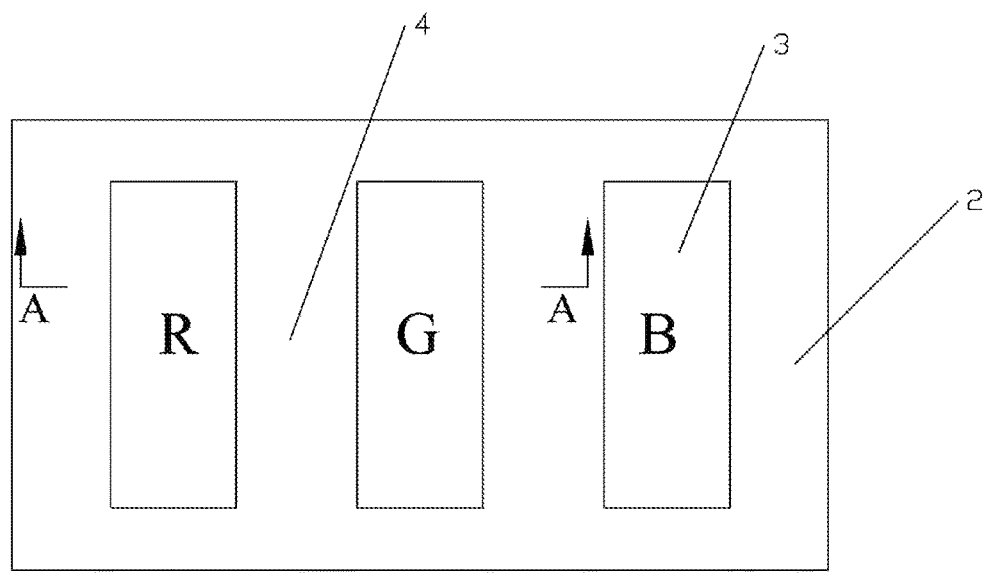
FIG. 1 is a plan view of the pixel define layer according to an embodiment of the disclosure.

The technical solutions in the embodiments of the disclosure will be described clearly and completely in connection with the drawings. Obviously, the embodiments described are only a part of the embodiments of the disclosure, but not all the embodiments. Based on the embodiments of the disclosure, all the other embodiments achieved by those of ordinary skill in the art without creative efforts belong to the scope of protection of the disclosure.

It should be noted that terms "up", "down", "top", "bottom" indicating a direction or position relationship are based on the direction or position relationship in the drawings. It is only to simplify the description, but not to indicate or imply that the devices or elements must have specific direction or are constructed or operated in a specific direction. They should not be understood as limitation of the disclosure.

In addition, an expression such as "first", "second" and "third" in the disclosure is only for the purpose of description, but cannot be understood as indicating or implying the relative importance. Expression of "a plurality of" indicates two or more except for other specific definition.

Figure 2:
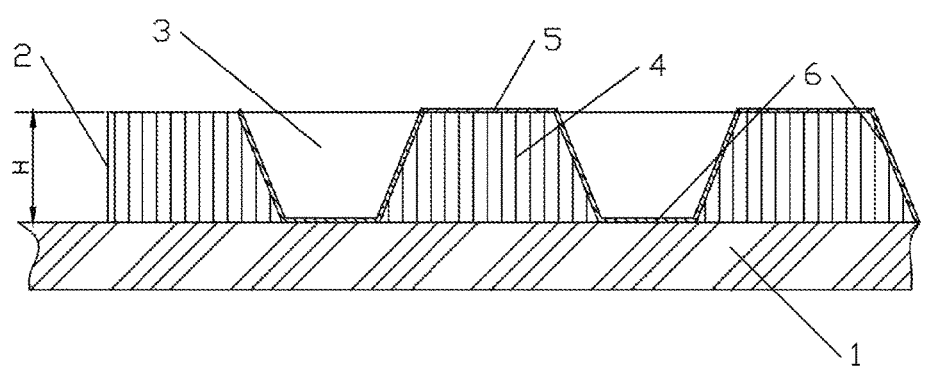
FIG. 2 is a cross-section view of the pixel define layer shown in FIG. 1 along the A-A direction.

Generally a pixel unit includes three sub-pixels, i.e. red (R), green (G) and blue (B), or four sub-pixels, i.e. red (R), green (G), blue (B) and white (W). FIG. 1 is a plan view of the pixel define layer according to an embodiment of the disclosure, which shows the pixel define layer for one pixel. As shown, the pixel define layer has three openings for containing red (R) ink, green (G) ink and blue (B) ink respectively to form the pixel unit with three sub-pixels. FIG. 2 is a cross-section view of the pixel define layer shown in FIG. 1 along A-A direction. As shown in FIGS. 1 and 2, the pixel define layer is arranged on the conductive layer of the substrate 1. The pixel define layer comprises a base film layer 2 which includes a plurality of openings 3. Each of the openings corresponds to a light-emitting region of a sub-pixel unit. A spacing base body 4 is formed between the adjacent openings 3. The upper surface of each spacing base body 4 is coated with a hydrophobic quantum dot material 5, and the sidewall of each opening 3 is coated with a hydrophilic quantum dot material 6. The longitudinal section of the spacing base body 4 may present trapezoid or reversed trapezoid.

According to some embodiments of the disclosure, the bottom of the opening 3 is also coated with the hydrophilic quantum dot material 6. It should be noted that the bottom of the opening 3 is the surface of the conductive layer of the substrate 1.

According to some embodiments of the disclosure, the height (H) of the spacing base body 4 may be 0.1 μm-100 μm, as shown in FIG. 2. According to some embodiments of the disclosure, the height (H) of the spacing base body 4 may be 0.5 μm-5 μm. For example, the height (H) of the spacing base body 4 may be 0.1 μm, 0.5 μm, 5 μm, 10 μm, 20 μm, 50 μm and 100 μm.

Using the pixel define layer according to some embodiments of the disclosure to manufacture the light emitting display can ensure that the ink within the sub-pixel would not ooze to the outside of the sub-pixel to result in color mixture between the adjacent sub-pixels, and can ensure that the ink spreads on the substrate within the sub-pixel to avoid apertures. The manufacturing process is simple and suitable for large size. Also, the emission spectrum of the quantum dot has the advantages of continuity and high color rendering. Therefore the quantum dot exciting spectrum is wide and presents continuous distribution. Sometimes the quantum dot with different colors can be excited by the same wavelength of light, such that the desired spectrum can be selected efficiently to increase the emission efficiency.

It should be noted that the embodiments described above only takes one pixel as an example. Actually, in some embodiments, the base film layer is formed on the substrate, and the base film layer has the openings arranged in arrays. The side walls of the openings are coated with the hydrophilic quantum dot material, and the spacing base bodies between the adjacent openings are coated with the hydrophobic quantum dot material. In order to avoid the pollution between any pixels and sub-pixels, the whole upper surface of the base film layer is sprayed with the hydrophobic quantum dot material, which falls within the scope of the present disclosure.

With reference to FIG. 3, the method for manufacturing the pixel define layer according to an embodiment of the disclosure comprises:

S1: coating a layer of photoresist on the conductive layer of the substrate, forming a plurality of openings by exposing, developing and etching, each of the openings corresponding to the light-emitting region of the sub-pixel unit, and the spacing base body being formed between adjacent openings, thereby forming a base film layer;

S2: spraying the hydrophobic quantum dot material on the upper surfaces of the spacing base bodies, and spraying the hydrophilic quantum dot material on the side walls of the openings or the side walls and the bottoms of the openings; or spraying the hydrophilic quantum dot material on the upper surfaces of the spacing base bodies and the side walls of the openings or spraying the hydrophilic quantum dot material on the upper surfaces of the spacing base bodies and the side walls and the bottoms of the openings, and transforming the hydrophilic quantum dot material on the upper surfaces of the spacing base bodies into the hydrophobic quantum dot material; or spraying the hydrophobic quantum dot material on the upper surfaces of the spacing base bodies and the side walls of the openings or spraying the hydrophobic quantum dot material on the upper surfaces of the spacing base bodies and the side walls and the bottoms of the openings, and transforming the hydrophobic quantum dot material on the side walls of the openings or the side walls and the bottoms of the openings into the hydrophilic quantum dot material.

Next the method for manufacturing the pixel define layer for the pixel including three sub-pixels will be described, as an example.

As shown in FIG. 4, a layer of positive photoresist 11 is coated on the conductive layer of the substrate 1. According to some embodiments of the disclosure, the substrate 1 may be made of conductive glass, but not limit to the conductive glass. The conductive glass may be formed by forming a layer of transparent conductive oxide, such as indium tin oxide, aluminum zinc oxide and indium zinc oxide, etc. on the upper surfaces of the transparent glass by means of sputtering or ion plating.

Figure 5:
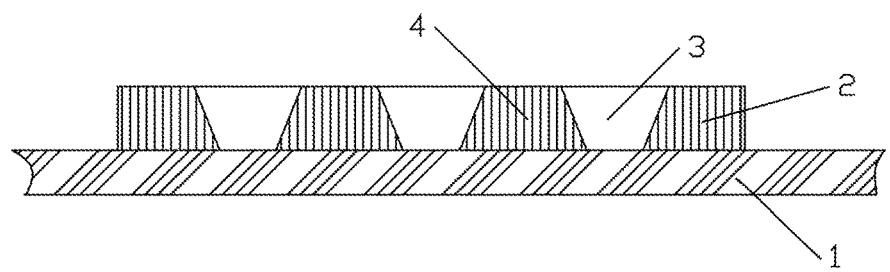
FIG. 5 is a cross-section view of the base film layer formed by the manufacturing method according to an embodiment of the disclosure.

As shown in FIG. 5, after exposing and developing the positive photoresist 11, a plurality of openings 3 may be formed by photo-etching the positive photoresist using a mask plate. Each of the openings 3 corresponds to the light-emitting region of the sub-pixel unit, and the spacing base body 4 is formed between the adjacent openings 3. Thus the base film layer 2 can be formed. According to some embodiment of the disclosure, the longitudinal section of the spacing base body 4 may present trapezoid.

Figure 6:
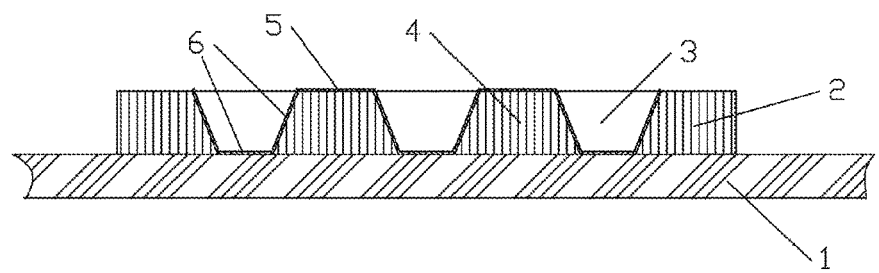
FIG. 6 is a cross-section view of the pixel define layer manufactured by the manufacturing method according to an embodiment of the disclosure.
Figure 7:
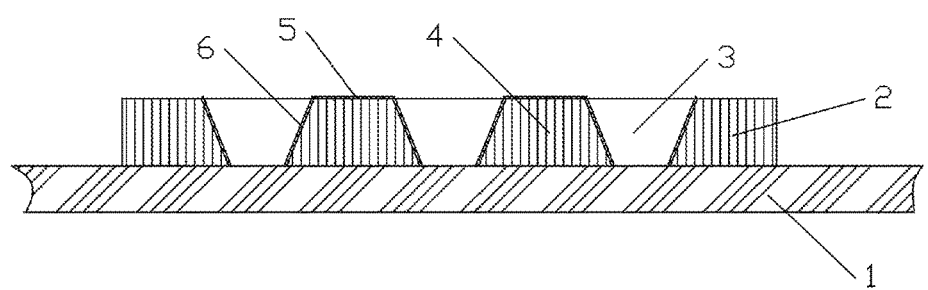
FIG. 7 is a cross-section view of the pixel define layer manufactured by the manufacturing method according to another embodiment of the disclosure.

As shown in FIG. 6, the hydrophobic quantum dot material 5 is sprayed on the upper surfaces of spacing base bodies 4, and the hydrophilic quantum dot material 6 is sprayed on the side walls and the bottoms of the openings 3. Alternatively, as shown in FIG. 7, the hydrophobic quantum dot material 5 is sprayed on the upper surfaces of the spacing base bodies 4, and the hydrophilic quantum dot material 6 is sprayed on the side walls of the openings 3.

It should be noted that the positive photoresist can be replaced with the negative photoresist, and the longitudinal section of the formed spacing base body can present reversed trapezoid.

Next another method for manufacturing the pixel define layer of the pixel with three sub-pixels will be described, as an example.

Figure 8:
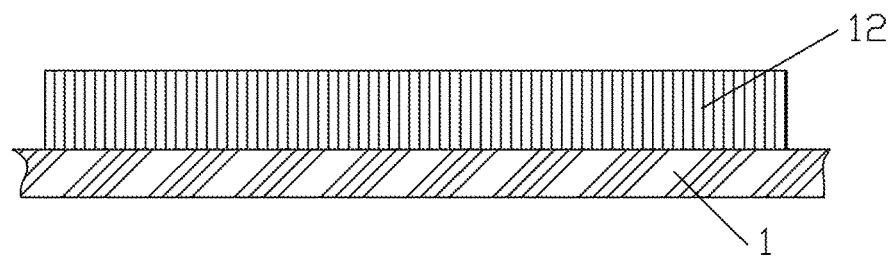
FIG. 8 is a cross-section view illustrating the coating of the negative photoresist in the manufacturing method according to another embodiment of the disclosure.

As shown in FIG. 8, a layer of negative photoresist 12 is coated on the conductive layer of the substrate 1.

Figure 9:
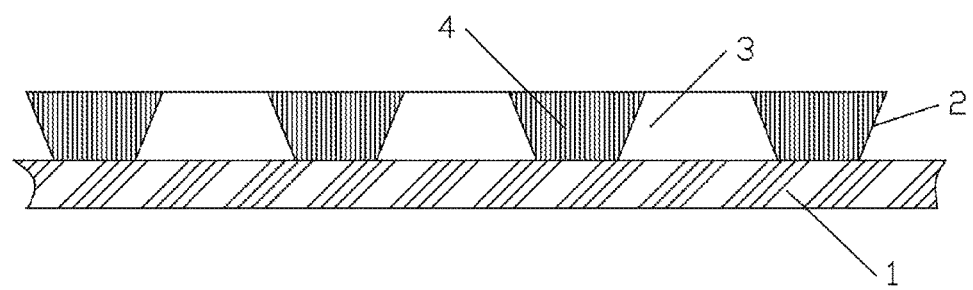
FIG. 9 is a cross-section view of the base film layer formed by the manufacturing method according to another embodiment of the disclosure.

As shown in FIG. 9, after exposing and developing the negative photoresist 12, a plurality of openings 3 may be formed by photo-etching the negative photoresist 12 using the mask plate. Each of the openings 3 corresponds to the light-emitting region of the sub-pixel unit, and the spacing base body 4 is formed between the adjacent openings 3. Thus the base film layer 2 is formed. According to some embodiment of the disclosure, the longitudinal section of the spacing base body 4 may present reversed trapezoid.

Figure 10:
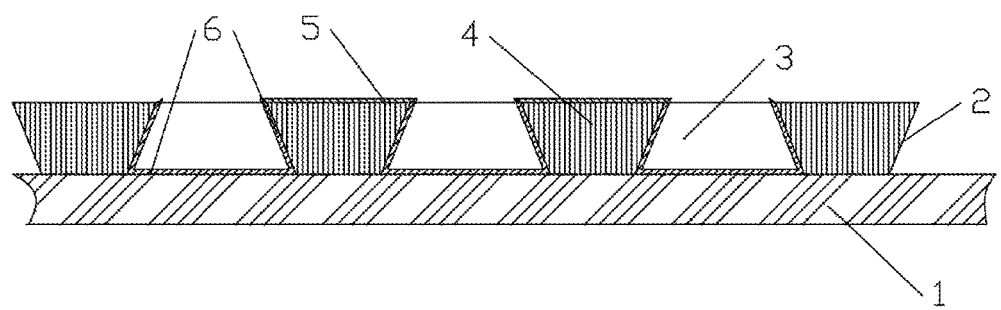
FIG. 10 is a cross-section view of the pixel define layer manufactured by the manufacturing method according to yet another embodiment of the disclosure.

As shown in FIG. 10, the hydrophobic quantum dot material 5 is sprayed on the upper surfaces of the spacing base bodies 4 and the side walls and the bottoms of the openings 3. The hydrophobic quantum dot material 5 on the side walls of the openings 3 or on the side walls and the bottoms of the openings 3 may be transformed into the hydrophilic quantum dot material 6 by means of functional group replacement, ultrasonic emulsification or photo-irradiation. For example, the hydrophobic quantum dot material may be transformed into the hydrophilic quantum dot material by means of mercaptocarboxylic acid substitution. Alternatively, after the upper surfaces of the spacing base bodies 4 are covered with the mask plate, the base film layer may be irradiated with the ultraviolet (e.g. the ultraviolet with the wavelength about 2540 Angstroms). Then the hydrophobic quantum dot material on the side walls and the bottoms of the openings 3 may be transformed into the hydrophilic quantum dot material.

It should be noted that the negative photoresist may be replaced with the positive photoresist, and the longitudinal section of the formed spacing base body can present trapezoid. It is also possible to spray no quantum dot material on the bottoms of the openings.

According to yet another embodiment of the disclosure, the difference from the above embodiments is that the hydrophilic quantum dot material may be sprayed on the upper surfaces of the spacing base bodies and the side walls of the openings, or the hydrophilic quantum dot material may be sprayed on the upper surfaces of the spacing base bodies and the side walls and the bottoms of the openings. The hydrophilic quantum dot material on the upper surfaces of the spacing base bodies may be transformed into the hydrophobic quantum dot material by means of functional group replacement.

It should be noted that, in some embodiments of the disclosure, the spraying may be nozzle spraying or arc spraying.

The pixel define layer manufactured by the method for manufacturing the pixel define layer according to some embodiments of the disclosure comprises the base film layer, and the side walls of the openings in the base film layer or the side walls and the bottoms of the openings are coated with the hydrophilic quantum dot material, and the upper surfaces of the spacing base bodies are coated with the hydrophobic quantum dot material. Therefore the ink within the pixel would not ooze to the outside of the pixel to result in color mixture between adjacent pixels. Compared with other types of double-layer pixel define layer, the light emitting region within the pixel would not be decreased. By selecting the suitable quantum dot material, the photochromic efficiency can be improved. The manufacturing process is simple and suitable for large size. The material of the quantum dot can be changed to adapt the actual condition of device.

The above are only specific embodiments of the present disclosure, but the disclosure is not limited thereto. A person skilled in the art can make changes and variations within the scope of the present disclosure. The changes and variations should fall within the protection scope of the present disclosure. Therefore, the protection scope of the present disclosure should be defined by the appended claims.

What is claimed is:

1. A pixel define layer arranged on a conductive layer of a substrate, the pixel define layer comprising:
   a base film layer defining a plurality of openings and at least one spacing base body, each of the plurality of openings corresponding to a light-emitting region of a sub-pixel unit and including a side wall, and each spacing base body positioned between adjacent ones of the plurality of openings and including an upper surface;

wherein the upper surface of each spacing base body is coated with a hydrophobic quantum dot material, and the side wall of each opening is coated with a hydrophilic quantum dot material.

2. The pixel define layer according to claim 1, wherein a longitudinal section of the spacing base body defines a trapezoid or a reversed trapezoid.

3. The pixel define layer according to claim 1, wherein a height of the spacing base body is in a range of 0.1 µm-100 µm.

4. The pixel define layer according to claim 1, wherein a height of the spacing base body is in a range of 0.5 µm-5 µm.

5. The pixel define layer according to claim 1, wherein a bottom of each opening is coated with the hydrophilic quantum dot material.

6. The pixel define layer according to claim 1, wherein the substrate comprises a conductive glass substrate.

7. A light emitting display including a display surface and the pixel define layer according to claim 1.

8. A method for manufacturing a pixel define layer, the method comprising:

forming a base film layer by coating a layer of photoresist on a conductive layer of a substrate, and forming a plurality of openings and a plurality of spacing base bodies by exposing, developing and etching the layer of photoresist, each of the openings corresponding to a light-emitting region of a sub-pixel unit and including a side wall and a bottom, and each spacing base body formed between adjacent ones of the plurality of openings and including an upper surface; and spraying a hydrophobic quantum dot material on the upper surfaces of the spacing base bodies, and spraying a hydrophilic quantum dot material on the side walls of the openings or the side walls and the bottoms of the openings.

9. The method according to claim 8, wherein the photoresist comprises a negative photoresist and a longitudinal section of each spacing base body defines a reversed trapezoid.

10. The method according to claim 8, wherein the photoresist comprises a positive photoresist and a longitudinal section of each spacing base body defines a trapezoid.

11. The method according to claim 8, wherein:
the hydrophobic quantum dot material is transformed into the hydrophilic quantum dot material by functional group replacement, ultrasonic emulsification or photo-irradiation; or
the hydrophilic quantum dot material is transformed into the hydrophobic quantum dot material by functional group replacement.

12. The method according to claim 8, wherein the substrate comprises conductive glass.

13. A method for manufacturing a pixel define layer, the method comprising:

forming a base film layer by coating a layer of photoresist on a conductive layer of a substrate, and forming a plurality of openings and a plurality of spacing base bodies by exposing, developing and etching the layer of photoresist, each of the openings corresponding to a light-emitting region of a sub-pixel unit and including a side wall and a bottom, and each spacing base body formed between adjacent ones of the plurality of openings and including an upper surface; and spraying the hydrophilic quantum dot material on the upper surfaces of the spacing base bodies and the side walls of the openings, or spraying the hydrophilic quantum dot material on the upper surfaces of the spacing base bodies and the side walls and the bottoms of the openings; and transforming the hydrophilic quantum dot material on the upper surfaces of the spacing base bodies into hydrophobic quantum dot material.

14. The method according to claim 13, wherein the photoresist comprises a negative photoresist and a longitudinal section of the spacing base body defines a reversed trapezoid.

15. The method according to claim 13, wherein the photoresist comprises a positive photoresist and a longitudinal section of the spacing base body defines a trapezoid.

16. The method according to claim 13, wherein:
the hydrophobic quantum dot material is transformed into the hydrophilic quantum dot material by functional group replacement, ultrasonic emulsification or photo-irradiation; or
the hydrophilic quantum dot material is transformed into the hydrophobic quantum dot material by functional group replacement.

17. A method for manufacturing a pixel define layer, the method comprising:

forming a base film layer by coating a layer of photoresist on a conductive layer of a substrate, and forming a plurality of openings and a plurality of spacing base bodies by exposing, developing and etching the layer of photoresist, each of the openings corresponding to a light-emitting region of a sub-pixel unit and including a side wall and a bottom, and each spacing base body formed between adjacent ones of the plurality of openings and including an upper surface; and spraying the hydrophobic quantum dot material on the upper surfaces of the spacing base bodies and the side walls of the openings, or spraying the hydrophobic quantum dot material on the upper surfaces of the spacing base bodies and the side walls and the bottoms of the openings; and transforming the hydrophobic quantum dot material on the side walls of the openings or the side walls and bottoms of the openings into hydrophilic quantum dot material.

18. The method according to claim 17, wherein the photoresist comprises a negative photoresist and a longitudinal section of the spacing base body defines a reversed trapezoid.

19. The method according to claim 17, wherein the photoresist comprises a positive photoresist and a longitudinal section of the spacing base body defines a trapezoid.

20. The method according to claim 17, wherein:
the hydrophobic quantum dot material is transformed into the hydrophilic quantum dot material by functional group replacement, ultrasonic emulsification or photo-irradiation; or
the hydrophilic quantum dot material is transformed into the hydrophobic quantum dot material by functional group replacement.

* * * * *